(12) United States Patent
Fonverne et al.

(10) Patent No.: US 8,029,863 B2
(45) Date of Patent: Oct. 4, 2011

(54) METHOD FOR FABRICATING A MICROFLUIDIC COMPONENT COMPRISING AT LEAST ONE MICROCHANNEL FILLED WITH NANOSTRUCTURES

(75) Inventors: Agnès Fonverne, Vizille (FR); Jean Dijon, Champagnier (FR); Florence Ricoul, Quaix-en-Chartreuse (FR); Emmanuelle Rouviere, Saint-Enrève (FR)

(73) Assignee: Commissariat à l'Energie Atomique, Paris (FR)

( * ) Notice: Subject to any disclaimer, the term of this patent is extended or adjusted under 35 U.S.C. 154(b) by 612 days.

(21) Appl. No.: 12/230,924

(22) Filed: Sep. 8, 2008

(65) Prior Publication Data

US 2009/0084496 A1    Apr. 2, 2009

(30) Foreign Application Priority Data

Sep. 28, 2007  (FR) ...................... 07 06837

(51) Int. Cl.
   *B32B 38/00*   (2006.01)
   *C23C 16/00*   (2006.01)
(52) U.S. Cl. ...................... 427/301; 427/249.1
(58) Field of Classification Search .......... None
   See application file for complete search history.

(56) References Cited

U.S. PATENT DOCUMENTS

| 2004/0096992 | A1 | 5/2004 | Harris et al. | |
| 2005/0176228 | A1* | 8/2005 | Fonash et al. | 438/597 |
| 2007/0110639 | A1* | 5/2007 | Joshi et al. | 422/130 |

FOREIGN PATENT DOCUMENTS

WO   WO 2006/122697 A1   11/2006

OTHER PUBLICATIONS

A. Fonverne et al. "In situ synthesized carbon nanotubes as a new nanostructured stationary phase for microfabricated liquid chromatographic column" Sensors and Actuators, vol. 129, No. 2, pp. 510-517, Sep. 7, 2007.
G. Ocvirk et al. "High performance liquid chromatography partially integrated onto a silicon chip" Analytical Methods and Instrumentation, vol. 2, No. 2, pp. 74-82, 1995.
I. Gusev et al. "Capillary columns with in situ formed porous monolithic packing for micro high-performance liquid chromatography and capillary electrochromatography" Journal of Chromatography A, 855, pp. 273-290, 1999.

(Continued)

*Primary Examiner* — Timothy Meeks
*Assistant Examiner* — Joseph Miller, Jr.
(74) *Attorney, Agent, or Firm* — Oliff & Berridge, PLC

(57) ABSTRACT

A microfluidic component comprises at least one closed microchannel filled with nanostructures. The microchannel is produced by previously forming an opening delineating a bottom wall and two opposite side walls of the microchannel in a surface of a substrate. The nanostructures filling said microchannel are formed by in situ growth to constitute a layer of metallic catalyst deposited on said side walls and on said wall bottom. The microchannel is closed, before the nanostructures are formed, by sealing a protective cover onto said surface of the substrate. Sealing is obtained by formation of an eutectic compound between a material of the cover and the metal of the catalyst used for in situ growth of the nanostructures and deposited on the surface of the substrate designed to come into contact with the cover.

10 Claims, 3 Drawing Sheets

OTHER PUBLICATIONS

J. Luong et al. "Electrophoretic separation of aniline derivatives using fused silica capillaries coated with acid treated single-walled carbon nanotubes" Journal of Chromatography A, 1074, pp. 187-194, 2005.

M. Stadermann et al. "Ultrafast gas chromatography on single-wall carbon nanotube stationary phases in microfabricated channels" Anal. Chem., 78, pp. 5639-5644, 2006.

M. Karwa et al. "Gas chromatography on self-assembled, single-walled carbon nanotubes" Anal Chem., 78, pp. 2064-2070, 2006.

C. Saridara et al. "Chromatography on self-assembled carbon nanotubes" Anal Chem., 77, pp. 7094-7097.

Z. Xiao et al. "Low temperature silicon wafer-to-wafer bonding with nickel silicide" J. Electrochem. Soc., vol. 145, No. 4, pp. 1360-1362, Apr. 1998.

* cited by examiner

METHOD FOR FABRICATING A MICROFLUIDIC COMPONENT COMPRISING AT LEAST ONE MICROCHANNEL FILLED WITH NANOSTRUCTURES

BACKGROUND OF THE INVENTION

The invention relates to a method for fabricating a microfluidic component comprising at least one microchannel delineated by bottom and top walls and two opposite side walls, a method comprising:
- formation, in a surface of a substrate, of the bottom wall and of the two opposite side walls of said microchannel,
- formation of nanostructures filling said microchannel by in situ growth from a metallic catalyst layer deposited on the opposite side walls and on the bottom wall of said microchannel,
- and formation of the top wall of said microchannel by positioning a cover on said surface of the substrate and sealing said cover on said surface.

State of the art

Microfluidic components, also called fluidic microsystems, such as microreactors or microlabs known under the name of "µ-TAS" (micro Total Analysis System) or "Lab-on-a-chip", have really taken off over the last decade for performing chemical or biological operations and/or analyses on samples of very small volumes. The use of these components can in fact enable different steps to be integrated on a single component (injection, separation, detection), thereby limiting the number of connections and therefore loss of samples during the different handling operations, while at the same time increasing the sensitivity of analysis and reducing the analysis time.

It is however sought to integrate an increasing number of functions into these microfluidic components. For example, it is desirable to produce microfluidic components enabling several operations to be performed, such as pre-processing on a sample, filtration, mixing, separation and/or detection operations. Such an integration does however require components enabling ever improved performances in terms of miniaturization and/or efficiency to be obtained. Furthermore, it is known that the efficiency of a heterogeneous chemical or biological reaction or the efficiency of a separation is all the greater the higher the ratio between the surface of the component in contact with the sample and the sample volume circulating in said component. Such a ratio is also referred to as the S/V ratio.

The most conventional approaches to obtain a high S/V ratio consist in filling microchannels formed in microfluidic components by porous structures or stationary phases, such as silica beads.

Thus, in the article "High performance liquid chromatography partially integrated onto a silicon chip" by Gregor Ocvirk et al. (Analytical Methods and Instrumentation, Vol 2, N°2, 74-82 (1995)), a liquid chromatography system is achieved by forming a network of microchannels filled with a filling material, in a flat silicon structure (or chip) with a split injector disposed at the inlet of said microchannels, and a frit and optic detection cell arranged on outlet of said microchannels. The microchannels of the system are sealed by an anodic sealing process by means of a layer of glass disposed on the silicon structure. Another silicon structure, completing the system, is sealed by the same sealing process on the glass layer to make the system more resilient.

However, on account of the diameter of the microchannels, filling a microchannel homogeneously with a stationary phase becomes a difficult operation to perform on a microscopic scale. Likewise, these components require systems to be set up that retain the stationary phase inside the microchannels, such as frits or injection systems. This operation does however also become difficult on this scale.

Other approaches have been envisaged to remedy this problem. It has for example been proposed to perform the stationary phase directly in a microchannel. Thus, as described in the article "Capillary columns with in situ formed porous monolithic packing for micro high-performance liquid chromatography and capillary electrochromatography" by Isabelle Gusev et al. (Journal of Chromatography A, 855 (1999) 273-290), in situ synthesis of a monolithic stationary phase anchored on the walls of a microchannel enables the use of frits to be done away with. It has also been proposed to use the techniques used in the microelectronics field (photolithography, etching) to form a stationary phase inside a microchannel by nano-patterning in reproducible and collective manner.

Recent developments in the field of methods for synthesizing nanostructures, such as carbon nanotubes, also referred to as CNT, or carbon nanofibers moreover enable new perspectives for developing the contact surface of microfluidic components to be envisaged. There are two major development directions.

The first direction consists in producing independent carbon nanotubes from catalytic powders, i.e. that are not securely united to a surface, and in then filling the microfluidic component and more particularly the microchannel or microchannels of said component with these previously synthesized carbon nanotubes. Extraction cartridges on solid phase, but also chromatography columns have thus been developed according to this principle. For example, in the article "Electrophoretic separation of aniline derivatives using fused silica capillaries coated with acid treated single-walled carbon nanotubes" by John H. T. Luong et al. (Journal of Chromatography A, 1074 (2005) 187-194), the surface of fused silica capillaries is prepared before being coated with acid treated single-walled carbon nanotubes. Deposition of nanotubes on the surface of the capillaries is achieved by rinsing said surface with a solution containing said previously synthesized and treated nanotubes.

The second direction enables carbon nanotubes to be formed in situ on a surface previously coated with a metallic catalyst deposition. Growth of the nanotubes can then be localized precisely by simple selective deposition of the catalyst. This technique also enables all the microchannel grafting or filling steps to be eliminated. For example, Michael Stadermann et al. in the article "Ultrafast gas chromatography on single-wall carbon nanotube stationary phases in microfabricated channels" (Anal. Chem. 2006, 78, 5639-5644) describe an ultrafast gas chromatography on stationary phases formed by single-wall carbon nanotubes (SWNTs) in microchannels microstructured in a silicon wafer. Said single-wall carbon nanotubes are obtained by in situ growth, by chemical vapor deposition, from a metallic catalyst layer, for example made of aluminum, molybdenum or iron. Patent application WO-A-2006/122697 likewise describes a microfluidic component comprising at least one microchannel delineated in a substrate and filled with nanotubes synthesized by in situ growth from a metallic catalyst layer previously deposited on the opposite side walls and on the bottom wall of said microchannel.

With this second direction, carbon nanotubes are generally produced in a microchannel without a top wall, i.e. in an open microchannel (or groove). This enables the homogeneity of deposition of the catalyst layer and growth of the nanotubes to be controlled. In Patent application WO-A-2006/122697, a protective cover is thus disposed on the substrate surface, after the nanotubes have been formed, to cover said microchannel filled with nanotubes. The cover is then sealed by molecular sealing forming Si—Si or Si—Glass bonds, which makes the microchannel closed and perfectly tight. Likewise, in the article by Michael Stadermann et al., the microchannels are closed by depositing a glass layer on the silicon wafer and performing anodic sealing after the nanotubes have been formed.

The cover sealing step, i.e. the microchannel closure step, does however prove to be a critical step in the microfluidic component fabrication process. The fabrication process in fact has to be compatible with this sealing step and in particular with the constraints it imposes. In general, nanotubes cannot withstand the prior cleaning steps necessary for performing wafer-wafer sealing, nor can they resist the high temperatures under oxidizing conditions of certain sealing techniques. The nanotubes are further liable to pollute the surfaces performing the sealing and/or the atmosphere of the machines used during the fabrication process.

A growth method in a closed environment has been proposed by Mahesh Karwa et al. in the article "Gas chromatography on self-assembled single-walled carbon nanotubes" (Anal. Chem. 2006, 78, 2064-2070). Single-Walled Carbon Nanotubes (SWNTs) are formed in a stainless steel capillary tube and in a silica-coated stainless steel capillary tube by catalytic synthesis in vapor phase. An ethanol-based solution in which molybdenum acetate and hexahydrate cobalt nitride are dissolved is injected into the capillary tube at the same time as hydrogen to coat the tube with a layer of catalyst. Chemical vapor deposition (CVD) is then performed to form nanotubes by in situ growth. As the iron contained in the capillary tubes acts as catalyst for formation of Multi-Walled Carbon Nanotubes (MWNTs), the silica-coated capillary tube is preferred for producing SWNTs.

However, such a fabrication method and in particular deposition of catalyst by means of an ethanol-base solution is not practical to implement as it requires a large number of handling operations and is difficult to adapt to Microsystems.

To avoid the constraints linked with catalyst deposition, Chutarat Saridara and Somenath Mitra, in the article "Chromatography on Self-Assembled Carbon Nanotubes" (Anal. Chem. 2005, 77, 7094-7097), proposed using the iron found in the impurities of the stainless steel of the capillary tube as catalyst. However, formation of the carbon nanotubes proves inhomogeneous along the capillary tube.

OBJECT OF THE INVENTION

The object of the invention is to provide a method for fabricating a microfluidic component remedying the shortcomings mentioned above.

More particularly, the object of the invention is to provide a fabrication method whereby a microfluidic component comprising at least one microchannel homogeneously filled with nanostructures can be obtained easily and inexpensively. Advantageously the method has to be compatible with methods for producing collective components on wafers, while at the same time avoiding contaminating the environment of the microcomponent.

According to the invention, this object is achieved by the fact that a layer of said metallic catalyst is also deposited on the surface of the substrate designed to come into contact with the cover and that sealing is performed before the nanostructures are formed by heat treatment forming an eutectic compound between the metal of the metallic catalyst layer and a material of the cover.

According to a development of the invention, the layer of said metallic catalyst is deposited on the surface of the substrate designed to come into contact with the cover at the same time as that deposited on the opposite side walls and on the bottom wall of said microchannel.

According to another development of the invention, the thickness of the layer of said metallic catalyst deposited on the surface of the substrate designed to come into contact with the cover is comprised between 20 nm and 200 nm.

BRIEF DESCRIPTION OF THE DRAWINGS

Other advantages and features will become more clearly apparent from the following description of particular embodiments of the invention given for non-restrictive example purposes only and represented in the accompanying drawings, in which.

DESCRIPTION OF PARTICULAR EMBODIMENTS

Figure 1:
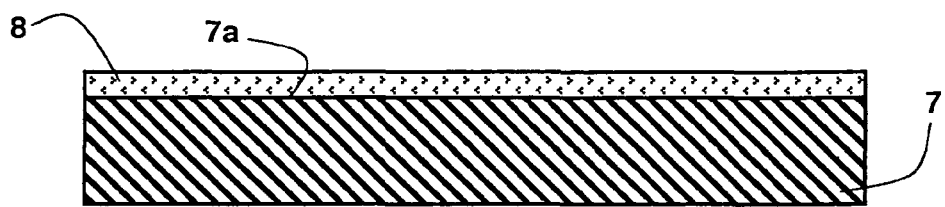
FIGS. 1 to 10 schematically represent, in cross-section, different successive steps of a particular embodiment of a fabrication method according to the invention.

A microfluidic component, also called fluidic microsystem, comprises at least one closed microchannel enabling a fluid to flow therein. Said microchannel is delineated by bottom and top walls and two opposite side walls and is filled with nanostructures, such as nanotubes and in particular carbon nanotubes.

The component is achieved by previously forming the bottom wall and the opposite two side walls of said microchannel in a surface of a substrate, for example made of silicon, silicon oxide or glass. Formation of the top wall of said microchannel is performed by fitting a cover comprising for example a material chosen from silicon, silicon oxide and glass, on said surface of the substrate and sealing the cover on said surface. Then the nanostructures filling the microchannel are formed by in situ growth from a layer of metallic catalyst deposited on the opposite side walls and on the bottom wall of said microchannel.

In this way, unlike fabrication methods described in the prior art and more particularly in the method described in Patent application WO-A-2006/122697, the top wall of the microchannel is formed before the nanostructures are formed. More particularly, a layer of the same metallic catalyst as the one used for formation of the nanostructures is also deposited on the substrate. Said layer is more particularly deposited on the surface of the substrate designed to come into contact with the cover. Sealing is then obtained before formation of the nanostructures by performing heat treatment enabling an eutectic compound to be formed. The eutectic compound is an eutectic compound between the metal of the metallic catalyst layer and a material of the cover or advantageously the material constituting said cover.

For example, FIGS. 1 to 10 illustrate a particular embodiment of a microfluidic component 1 comprising three closed microchannels 2. What is meant by closed microchannel is a microchannel of microscopic dimensions comprising an inlet and an outlet for passage of a fluid, but delineated not only by a bottom wall 3 forming the bottom of microchannel 2 and by two opposite side walls 4 and 5, but also by a top wall 6. Advantageously, the distance P between bottom wall 3 and top wall 6 is comprised between 5 μm and 100 μm whereas the distance L between the two opposite side walls 4 and 5 is preferably comprised between 1 μm and 500 μm.

Bottom wall 3 and the two opposite side walls 4 and 5 of each microchannel 2 are formed in a substrate 7, for example in a silicon wafer with a thickness of about 450 micrometers and a diameter of 100 mm.

Figure 2:
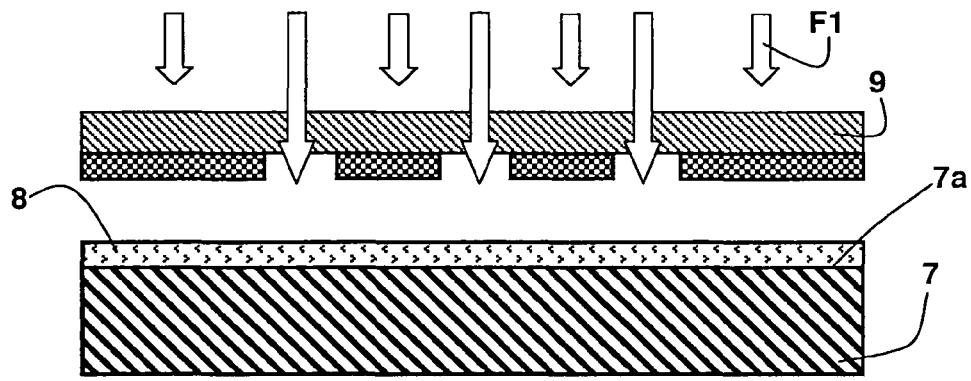
Figure 3:
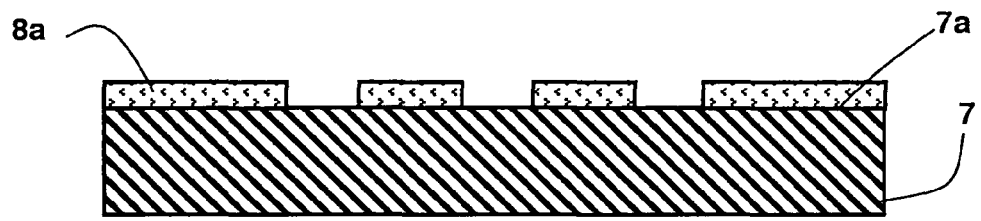
Figure 4:
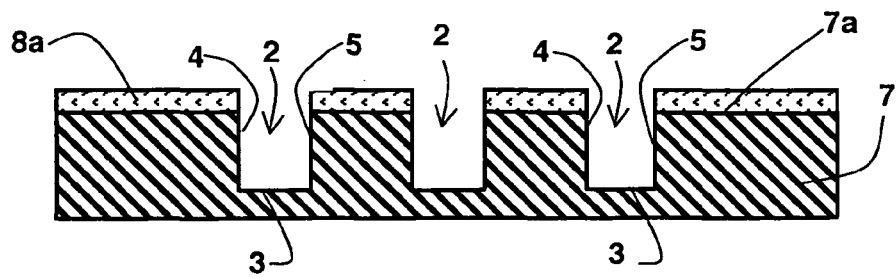
Figure 5:
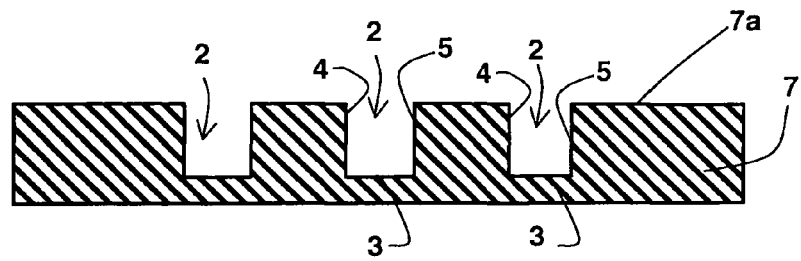

Thus, as represented in FIGS. 1 to 5, the three microchannels 2 are for example formed by selective etching in a substrate 7 comprising a free surface 7a. To perform selective etching, the whole of free surface 7a is, in FIG. 1, covered by a photoresist layer 8. Then, as represented in FIGS. 2 and 3, layer 8 is patterned in the form of patterns 8a by photolithography. Patterns 8a are thus formed by exposing layer 8 with UV radiation (arrows F1), through a mask 9, and then removing the exposed areas of layer 8. Then, as illustrated in FIG. 4, substrate 7 undergoes a Deep Reactive Ion Etching (DRIE) step. The etching step is said to be selective in so far as etching of substrate 7 is performed only at the level of the areas of substrate 7 not covered by patterns 8a. Thus, as represented in FIG. 5, it enables openings (or grooves), delineated in substrate 7 by surfaces forming side walls 4 and 5 and bottom wall 3 of each microchannel 2, to be formed in surface 7a of substrate 7. Once substrate 7 has been etched, patterns 8a of the photoresist layer are removed, thereby releasing surface 7a of substrate 7 provided with said microchannels 2.

Figure 6:
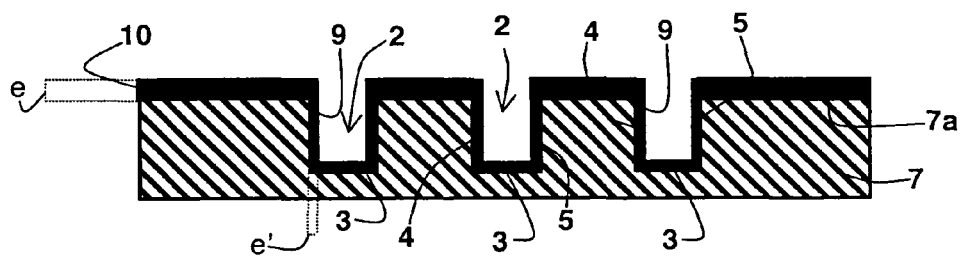

As represented in FIG. 6, a metallic catalyst deposition step is then performed. Side walls 4 and 5 and bottom wall 3 of each microchannel 2 are thus covered with a layer 9 of metallic catalyst. Furthermore, free surface 7a of substrate 7 is also covered with metallic catalyst. A layer 10 formed by the same metallic catalyst therefore covers said surface 7a. It is advantageously deposited at the same time as layer 9 covering side walls 4 and 5 and bottom wall 3 of the microchannels.

The metal forming the metallic catalyst is preferably chosen from nickel, cobalt, iron and gold and it can be deposited by a physical deposition technique, for example by sputtering or by evaporation, or by a chemical or electrolytic deposition technique. Depending on the technique used, the deposition conditions are optimized so as to obtain a layer of metallic catalyst 10 on free surface 7a of substrate 7 of sufficient thickness e to be able to perform the subsequent sealing step and a layer of metallic catalyst 9 on side walls 4 and 5 having a thickness e' compatible with growth of nanostructures.

The thickness e of metallic catalyst layer 10 deposited on free surface 7a of substrate 7 is preferably comprised between 20 nm and 200 nm, whereas the thickness e' of metallic catalyst layer 9 deposited on side walls 4 and 5 is advantageously comprised between 1 nm and 20 nm.

Figure 7:
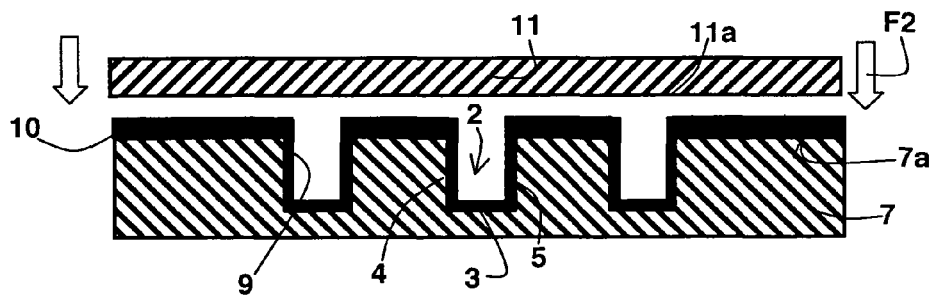
Figure 8:
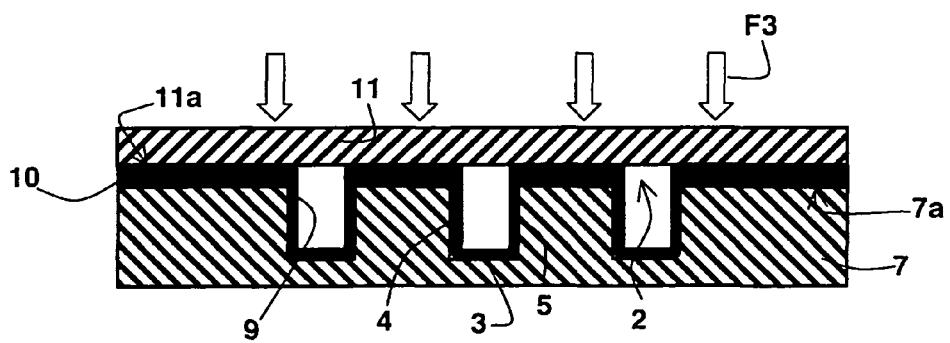
Figure 9:
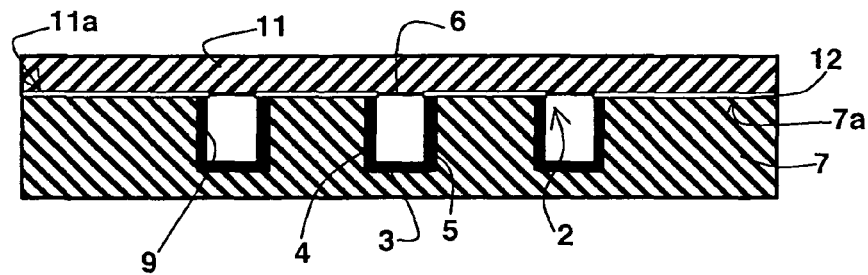

Thus, as represented in FIGS. 7 to 9, metallic catalyst layer 10 is then used to perform sealing between a protective cover 11 and substrate 7, before the nanostructures (for example carbon nanotubes) are formed.

Sealing is therefore achieved by forming an eutectic compound between the metal of metallic catalyst layer 10 and a material of cover 11. The material of cover 11 is advantageously chosen from silicon, silicon oxide and glass. As represented in FIG. 7, protective cover 11 is positioned or arranged on layer 10 covering surface 7a of substrate 7 (arrows F2), so that advantageously flat surface 11a of cover 11 comes into contact with surface 7a of substrate 7 and more particularly with layer 10 disposed on surface 7a. Then, as illustrated in FIG. 8, heat treatment (arrows F3) is performed at a predefined temperature enabling the metal contained in layer 10 to diffuse to cover 11 forming an eutectic compound 12 between said metal and a material of the cover. Thus, once protective cover 11 has been sealed on substrate 7, surface 11a of cover 11 comprises portions in contact with surface 7a and portions arranged facing microchannels 7. Said portions of surface 11a arranged facing microchannels 7 then form top walls 6 of said microchannels 2 and therefore enable them to be closed.

For example, for a layer 10 made of nickel and a cover 11 made of silicon or silicon oxide, sealing can be obtained by performing heat treatment enabling a nickel silicide to be formed. Such a sealing technique is for example known to seal two silicon wafers by formation of a nickel silicide at a heat treatment temperature of 440° C., as related by Zhi-Xiong Xiao et al. in the article "Low temperature silicon wafer-to-wafer bonding with nickel silicide" (J. Electrochem. Soc., Vol 145, N°4, April 1998).

Figure 10:
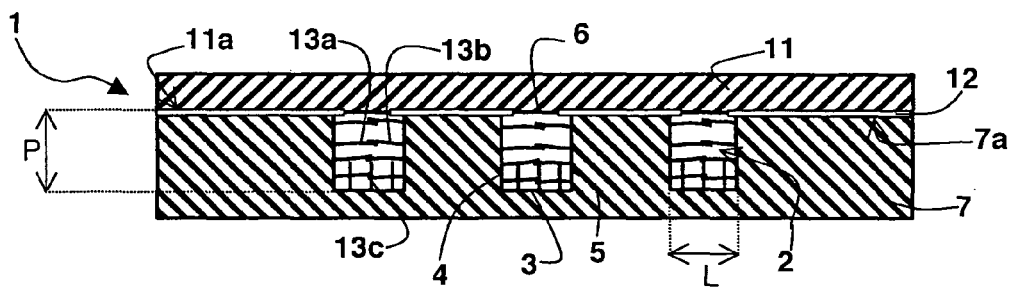

In the scope of the present invention, the metal used to perform sealing also acts as metallic catalyst for formation of the nanostructures in microchannels 2. The metallic catalyst layer 9 deposited, in FIG. 6, on side walls 4 and 5 and on bottom wall 3 then enables growth of the nanostructures such as carbon nanotubes to be catalyzed. The carbon nanotubes are for example obtained by chemical vapor deposition (CVD) performed at a temperature of 700° C. under atmospheric pressure using acetylene as carbonaceous gas. Thus, in one and the same thermal cycle, three sets of nanostructures, respectively 13a, 13b and 13c, are formed in FIG. 10 by growth, approximately perpendicularly to respective walls 4, 5 and 3. It is moreover advantageously possible to make a majority of nanostructures 13a join nanostructures 13b, as represented in FIG. 10, so as to fill microchannels 2. A cutting subsequent step can then be performed to form microreactors each provided with one or more microchannels 2 completely filled with nanostructures.

Figure 11:
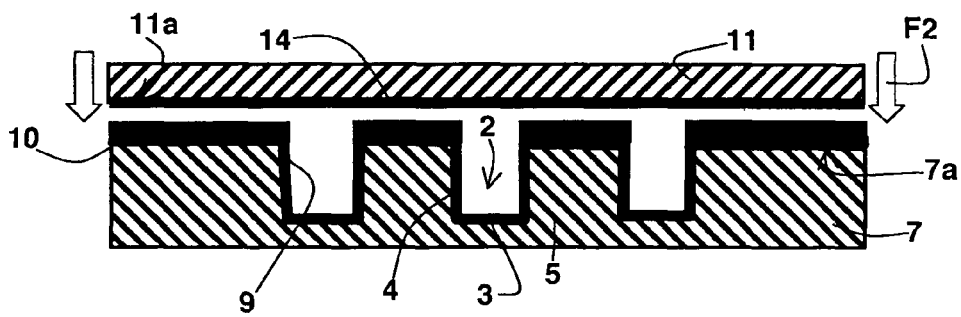
FIGS. 11 and 12 schematically represent, in cross-section, steps of a variant of the embodiment represented in FIGS. 1 to 10.
Figure 12:
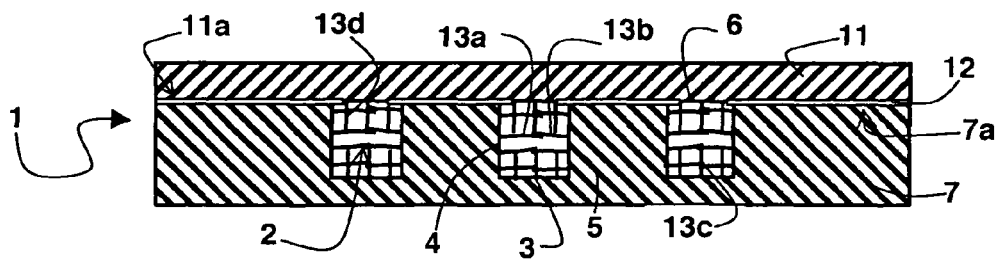

In an alternative embodiment represented in FIGS. 11 and 12, an additional metallic catalyst layer 14 is deposited on the whole surface 11a of cover 11. Surface 11a of cover 11 is the surface designed to come into contact with surface 7a of substrate 7 when said cover is placed on surface 7a of substrate 7. Thus, once the cover has been placed on surface 7a of substrate 7 and sealing has been performed, the portions of surface 11a arranged facing microchannels 2 and forming top walls 6 of said microchannels 2 remain covered by metallic catalyst and can therefore be the seat of in situ growth of nanostructures 13d from additional metallic catalyst layer 14. Nanostructures 13d are then formed on top wall 6 of each microchannel 2.

The method for producing a microfluidic component according to the invention thereby enables a metal to be used having a twofold function:
  precursor for sealing between the cover and substrate
  and catalyst for growth of the nanostructures.

This means that the number of technological steps to be performed can be reduced thereby reducing the manufacturing cost of the component, in particular compared with the component described in Patent application WO-A-2006/122697. In Patent application WO-A-2006/122697, when the metallic catalyst deposition operation is performed, a layer of metallic catalyst is in fact deposited on the remaining patterns of the photoresist layer so as to be removed with said patterns, before growth of the nanostructure, and sealing is performed after growth of the nanostructures. However, in the embodiments represented in FIGS. 1 to 12, the metallic catalyst is deposited after patterns 8a have been removed, not only on walls 3, 4 and 5 of microchannels 2, but also free surface 7a of substrate 7 to ensure sealing of cover 11, before growth of the nanostructures.

The microchannels are therefore closed before growth of nanostructures takes place. However, with such a fabrication method, growth of the nanostructures, obtained by in situ growth, remains homogeneous in spite of closing of the microchannels.

Finally, such a method is compatible with a method for producing collective components on silicon wafers and does not require any post-growth technological steps, which prevents any contamination of the outside environment on the component, such as deposition chambers and clean rooms used for performing these depositions or the operator present when the process is performed.

A microfluidic component obtained by such a method can be used in various applications. For example, it can be used as:

- catalytic decomposition support: if the nanostructure walls are covered by a platinum deposition, the microcomponent can for example be used for performing complete oxidation of CO into $CO_2$ by oxygen at lower temperature,
- enzyme grafting support: carbon nanotubes can easily be functionalized: the nanotubes can be grafted by an enzyme such as trypsin so as to use the microcomponent for digesting proteins,
- stationary phase support: carbon nanotubes constitute a stationary phase directly usable for chromatography applications; they can also be functionalized by various chemical molecules.

The invention is not limited to the embodiments represented in FIGS. 1 to 12. For example, microchannel or microchannels 2 of the microfluidic component can have any type of geometry. Their inlet can moreover be connected to a fluid division area itself connected to an inlet microchannel, whereas their outlet can be connected to a fluid assembly area itself connected to an outlet microchannel.

We claim:

1. A method for fabricating a microfluidic component comprising at least one microchannel delineated by bottom and top walls and two opposite side walls, the method comprising:
    formation, in a surface of a substrate, of the bottom wall and of the two opposite side walls of said microchannel,
    formation of nanostructures filling said microchannel by in situ growth from a first layer of a metallic catalyst deposited on the opposite side walls and on the bottom wall of said microchannel,
    and formation of the top wall of said microchannel by positioning a cover on said surface of the substrate and sealing said cover on said surface,
    wherein a second layer of said metallic catalyst is also deposited on surface of the substrate designed to come into contact with the cover and sealing is performed before the nanostructures are formed by heat treatment forming an eutectic compound between metal of the second layer of the metallic catalyst and a material of the cover.

2. The method according to claim 1, wherein the second layer of said metallic catalyst is deposited on the surface of the substrate designed to come into contact with the cover at the same time as the first layer of metallic catalyst that is deposited on the opposite side walls and on the bottom wall of said microchannel.

3. The method according to claim 1, wherein the thickness of the second layer of said metallic catalyst deposited on the surface of the substrate designed to come into contact with the cover is comprised between 20 nm and 200 nm.

4. The method according to claim 1, wherein the thickness of the first layer of metallic catalyst deposited on the opposite side walls and on the bottom wall of said microchannel is comprised between 1 nm and 20 nm.

5. The method according to claim 1, wherein nanostructures are formed on the top wall of the microchannel by in situ growth from an additional layer of metallic catalyst deposited on said wall.

6. The method according to claim 5, wherein the additional layer of metallic catalyst is deposited on the whole of the surface of the cover, designed to come into contact with the surface of the substrate when said cover is positioned.

7. The method according to claim 1, wherein the metallic catalyst is selected from the group consisting of nickel, cobalt, iron and gold.

8. The method according to claim 1, wherein the material of the cover is selected from the group consisting of silicon, silicon oxide and glass.

9. The method according to claim 1, wherein the two opposite side walls of the microchannel are separated by a distance comprised between 1 µm and 500 µm.

10. The method according to claim 1, wherein the top wall and bottom wall of the microchannel are separated by a distance comprised between 5 µm and 100 µm.

* * * * *